(12) United States Patent
Kim et al.

(10) Patent No.: US 7,749,912 B2
(45) Date of Patent: Jul. 6, 2010

(54) METHOD FOR FABRICATING BULB-SHAPED RECESS PATTERN

(75) Inventors: Myung-Ok Kim, Ichon-shi (KR); Tae-Hyoung Kim, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 194 days.

(21) Appl. No.: 11/748,617

(22) Filed: May 15, 2007

(65) Prior Publication Data

US 2008/0160766 A1 Jul. 3, 2008

(30) Foreign Application Priority Data

Jan. 3, 2007 (KR) ...................... 10-2007-0000749

(51) Int. Cl.
*H01L 21/302* (2006.01)
(52) U.S. Cl. ...................... 438/701; 438/270; 438/702; 438/703; 257/E21.214
(58) Field of Classification Search ................ 438/701, 438/700, 689, 270, 702; 257/E21.214
See application file for complete search history.

(56) References Cited

U.S. PATENT DOCUMENTS

| | | | | |
|---|---|---|---|---|
| 4,713,682 A | * | 12/1987 | Erie et al. ................ 257/774 |
| 4,996,572 A | * | 2/1991 | Tanaka et al. ............... 257/317 |
| 5,079,178 A | * | 1/1992 | Chouan et al. ............... 438/161 |
| 5,183,775 A | * | 2/1993 | Levy ........................... 438/386 |
| 5,246,801 A | * | 9/1993 | Pierrat ........................... 430/5 |
| 5,556,501 A | * | 9/1996 | Collins et al. .......... 156/345.38 |
| 5,650,041 A | * | 7/1997 | Gotoh et al. ................ 438/618 |
| 5,915,192 A | * | 6/1999 | Liaw et al. ................... 438/435 |
| 5,933,759 A | * | 8/1999 | Nguyen et al. ............. 438/700 |
| 6,326,300 B1 | * | 12/2001 | Liu et al. ..................... 438/638 |
| 6,376,384 B1 | * | 4/2002 | Yen et al. ..................... 438/706 |
| 6,451,703 B1 | * | 9/2002 | Liu et al. ..................... 438/710 |
| 6,576,547 B2 | * | 6/2003 | Li ............................... 438/637 |
| 2003/0052088 A1 | * | 3/2003 | Khan et al. .................... 216/67 |
| 2003/0189024 A1 | * | 10/2003 | Khan et al. ..................... 216/2 |
| 2004/0023475 A1 | * | 2/2004 | Bonser et al. ............... 438/585 |
| 2004/0038537 A1 | * | 2/2004 | Liu et al. ..................... 438/694 |

FOREIGN PATENT DOCUMENTS

| | | |
|---|---|---|
| KR | 1020000060693 | 10/2000 |
| KR | 1020060058959 | 6/2006 |
| KR | 1020060074983 | 7/2006 |
| KR | 100628378 | 9/2006 |

* cited by examiner

*Primary Examiner*—A. Sefer
*Assistant Examiner*—Allen L Parker
(74) *Attorney, Agent, or Firm*—Lowe Hauptman Ham & Berner, LLP (57) ABSTRACT

A method for fabricating a bulb-shaped recess pattern includes: forming an etch barrier layer over a substrate; forming a hard mask pattern in which a first polymer is attached to sidewalls of the hard mask pattern over the etch barrier layer; sequentially etching the etch barrier layer and the substrate to form a recess pattern in which a second polymer is attached to sidewalls of the recess pattern; removing the first and second polymers and the hard mask pattern; forming a plurality of spacers exposing a bottom portion of the recess pattern; and etching the exposed bottom portion of the recess pattern to form a ball pattern.

27 Claims, 13 Drawing Sheets
(4 of 13 Drawing Sheet(s) Filed in Color)

METHOD FOR FABRICATING BULB-SHAPED RECESS PATTERN

CROSS-REFERENCE TO RELATED APPLICATIONS

The present invention claims priority of Korean patent application number 10-2007-0000749, filed on Jan. 3, 2007 which is incorporated by reference in its entirety.

FIELD OF THE INVENTION

The present invention relates to a method for fabricating a semiconductor device, and more particularly, to a method for fabricating a bulb-shaped recess pattern used as a channel of a transistor.

BACKGROUND OF THE INVENTION

Recently, a recess pattern process using a recess channel has been suggested to secure a channel length of a transistor in fabricating a dynamic random access memory (DRAM) device. As a design rule of the DRAM device, a critical dimension (CD) of a recess gate should be controlled and reduced.

However, it is difficult to define a line width with less than 30 nm for patterning. Furthermore, if a bias level of a recess etch is increased, it becomes impossible to control the line width by less than 30 nm to satisfy a final inspection critical dimension (FICD). As the critical dimension of the recess gate is reduced, a mean free path of plasma particles at a recessed space gets shorter. Accordingly, a profile may be more bowing or sloped. Due to the bowing and sloped profiles, a channel length of the recess gate may be shorter compared with that of a vertical profile. Also, a silicon horn generated at an interface between an active region of the recess gate and a sidewall wall oxide layer may be increased. As a result, a refresh property of a device may be degraded.

Figure 1A:
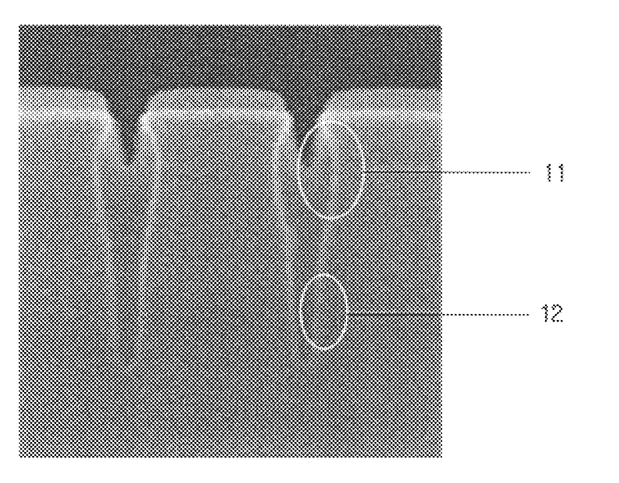
FIG. 1A illustrates bowing and sloped profiles during a typical recess pattern process.

FIG. 1A illustrates bowing and sloped profiles generated during a typical recess pattern process. A reference numeral 11 identifies the bowing profile and a reference numeral 12 identifies the sloped profile.

Figure 1B:
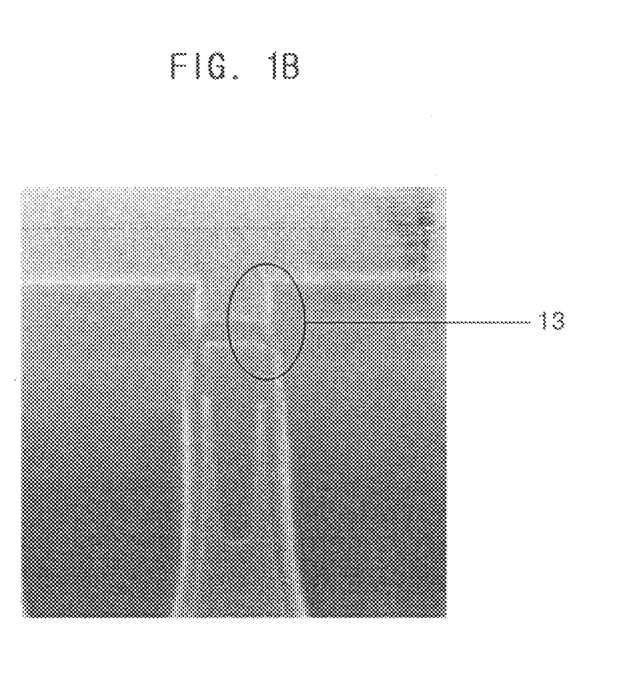
FIG. 1B illustrates an increase in a typical silicon horn.

FIG. 1B illustrates an increase in a silicon horn generated during a typical recess pattern process. A reference numeral 13 identifies the increased silicon horn.

As the design rule has been reduced, a bottom profile of the recess gate is deteriorated and thus, an electric field is increased. In order to ease the electric field, a bulb-shaped recess pattern process has been suggested. For the bulb-shaped recess pattern process, spacers are formed after a recess etching and then, an isotropic etching process is performed using the spacers as a barrier. As a result, a bending radius of the bottom profile is increased, thereby solving limitations of the recess gate. The bulb-shaped recess pattern process means a transistor process using a bulb-shaped recess pattern as a channel.

Figure 2:
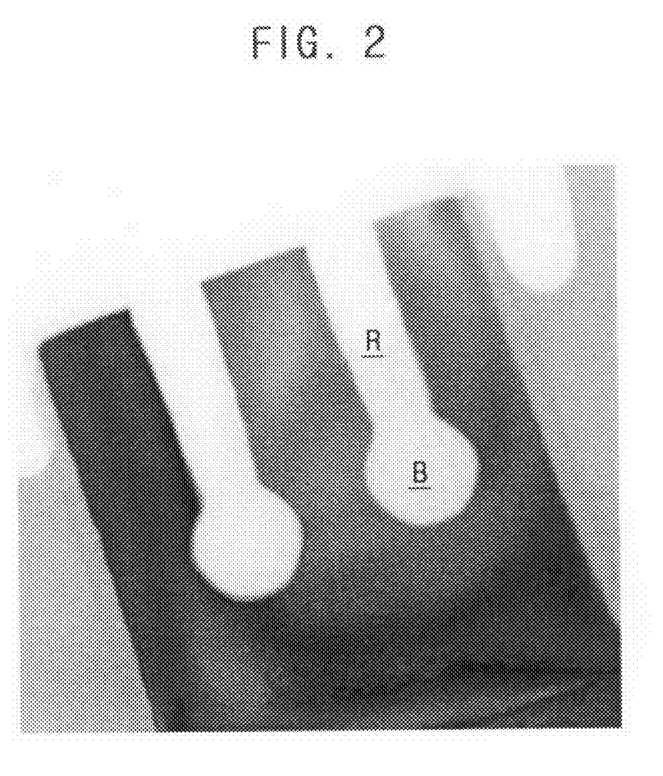
FIG. 2 illustrates a profile of a typical bulb-shaped recess pattern.

FIG. 2 illustrates a profile of a typical bulb-shaped recess pattern. The typical bulb-shaped recess pattern includes a recess pattern identified by a reference letter R and a ball pattern identified by a reference letter B.

Figure 3A:
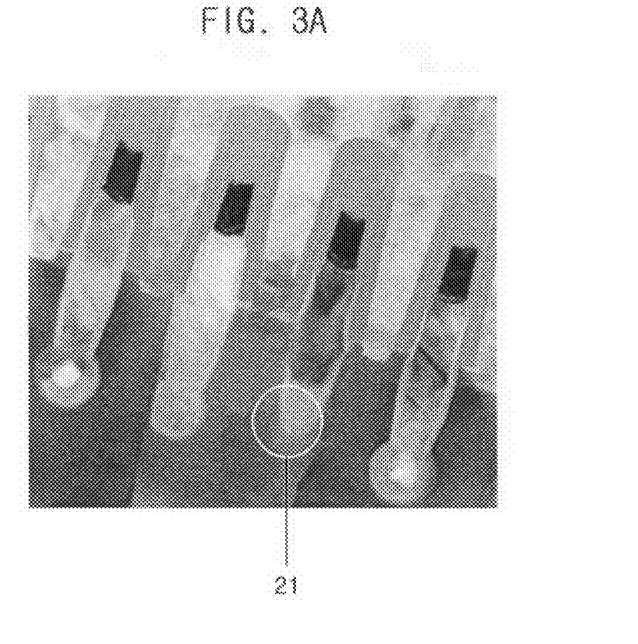
FIG. 3A illustrates a defect in a formation of a typical ball pattern.

FIG. 3A illustrates a defect in a formation of a typical ball pattern. In a bulb-shaped recess pattern process, spacers used during an isotropic etching process include one of a high temperature oxide (HTO) layer and a low pressure tetraethylortho silicate (LPTEOS) layer. Due to the use of the HTO layer, a process time is increased. Also, since the HTO layer is excessively formed at a bottom portion because of a difference in a deposition rate on a surface where the spacers are to be formed, a ball pattern may not be formed. A reference numeral 21 identifies a phenomenon (i.e., referred to as a ball-not-defined phenomenon) in which the ball pattern is not defined.

An excessive etch is performed to overcome the ball-not-defined phenomenon. If the excessive etch is performed, a top attack of the bulb-shaped recess is generated.

Figure 3B:
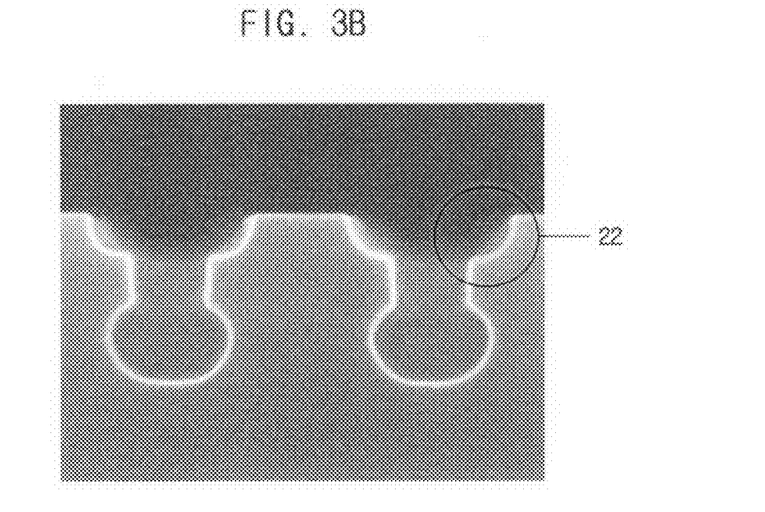
FIG. 3B illustrates a top attack of a typical recess pattern by an excessive etch.

FIG. 3B illustrates a top attack of a typical bulb-shaped recess generated by an excessive etch in which a top portion 22 of the bulb-shaped recess is damaged.

If the excessive etch is performed, a size of the ball pattern of the bulb-shaped recess is increased. In this case, a seam is generated inside the ball pattern while forming a subsequent gate polysilicon layer.

Figure 3C:
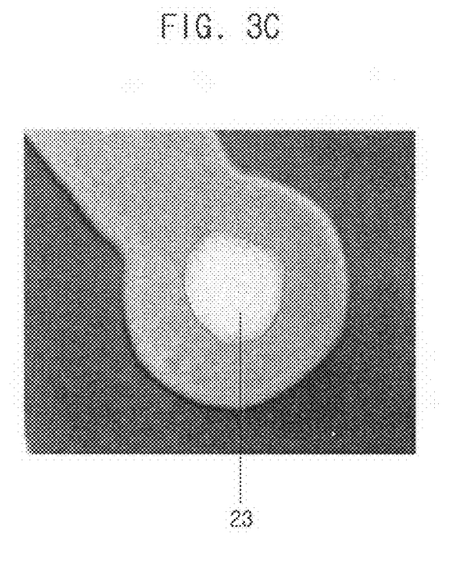
FIG. 3C illustrates a typical seam and a shift of the seam.
Figure 3D:
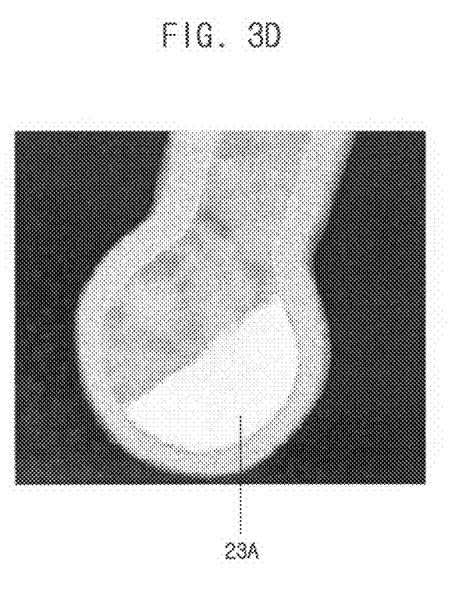
FIG. 3D illustrates a shift of a seam.

FIG. 3C illustrates a seam generated by an excessive etch, and FIG. 3D illustrates a shift of the seam. As shown in FIGS. 3C and 3D, due to the excessive etch, a size of the ball pattern is increased and as a result, a seam 23 is generated inside the ball pattern while forming a subsequent gate polysilicon layer. The seam 23 may shift to a gate oxide layer by the subsequent thermal process. A reference numeral 23A identifies a shifted seam. The shift of the seam 23 may degrade reliability of the device.

SUMMARY OF THE INVENTION

Embodiments of the present invention are directed toward providing a method for fabricating a bulb-shaped recess gate, wherein the method can reduce an increase in a bias of a critical dimension, bowing and sloped profiles, a top attack, a ball-not-defined phenomenon, an increase in a seam and a shift of the seam.

In accordance with an embodiment of the present invention, there is provided a method for fabricating a bulb-shaped recess pattern, including: forming an etch barrier layer over a substrate; forming a hard mask pattern whose sidewalls are adhered with a first polymer over the etch barrier layer; sequentially etching the etch barrier layer and the substrate to form a recess pattern whose sidewalls are adhered with a second polymer; removing the first and second polymers and the hard mask pattern; forming a plurality of spacers exposing a bottom portion of the recess pattern; and etching the exposed bottom portion of the recess pattern to form a ball pattern.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF SPECIFIC EMBODIMENTS

Figure 4A:
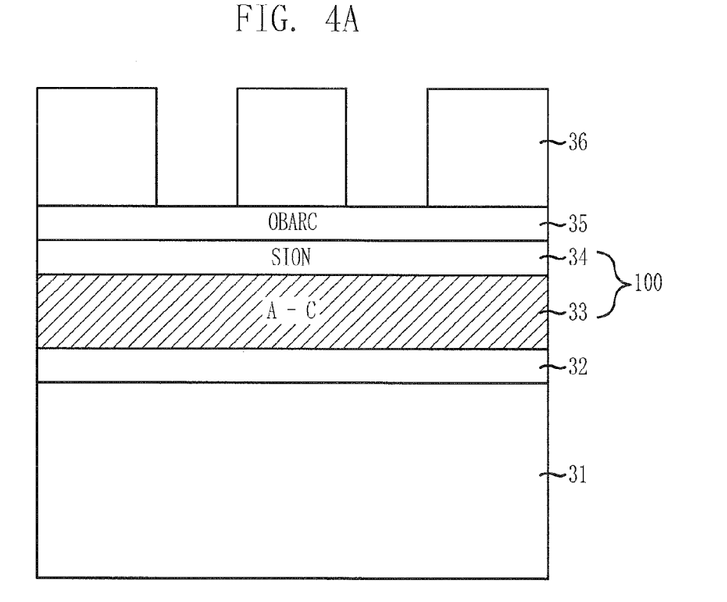
FIGS. 4A to 4H illustrate a method for fabricating a bulb-shaped recess pattern in accordance with an embodiment of the present invention.

Turning now to the drawings, FIGS. 4A to 4H illustrate a method for fabricating a bulb-shaped recess pattern in accordance with an embodiment of the present invention. As shown in FIG. 4A, an etch barrier layer 32 is formed over a substrate 31 in which an active region is defined. The etch barrier layer 32 serves as an etch barrier during an etching process to form a subsequent ball pattern. The etch barrier layer 32 includes an oxide layer.

A hard mask layer 100 required to perform a recess etch is formed over the etch barrier layer 32. The hard mask layer 100 is formed by stacking an amorphous carbon layer 33 and a silicon oxynitride (SiON) layer 34, and combination thereof. The SiON layer 34 serves as an etch barrier during etching the amorphous carbon layer 33, and the amorphous carbon layer 33 serves as an etch barrier during etching the substrate 31 to form recesses.

An anti-reflective coating layer 35 is formed over the hard mask layer 100. Then, a photoresist layer is formed over the anti-reflective coating layer 35 and subjected to a photo-exposure and developing process to form a photoresist pattern 36. The anti-reflective coating layer 35 includes an organic bottom anti-reflective coating (OBARC) layer.

Figure 4B:
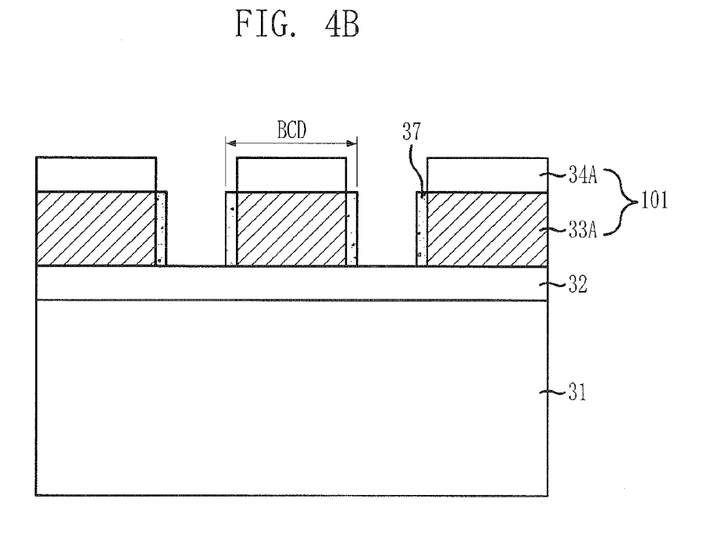

As shown in FIG. 4B, the anti-reflective coating layer 35 is etched using the photoresist pattern 36 as an etch barrier, and the hard mask layer 100 is continuously etched. In more detail about the etching of the hard mask layer 100, the SiON layer 34 is etched and then, the amorphous carbon layer 33 is etched. As a result, a hard mask pattern 101 including a SiON pattern 34A, an amorphous carbon pattern 33A, and combination thereof is obtained. As an example, the hard mask pattern 101 can be a multi-layered structure. When the formation of the amorphous carbon pattern 33A is completed, the photoresist pattern 36 and the amorphous carbon layer 35 may not remain.

Particularly, the etching of the amorphous carbon layer 33 includes using a gas selected from a group consisting of nitrogen ($N_2$), hydrogen ($H_2$), oxygen ($O_2$), hydrogen bromide (HBr), chlorine ($Cl_2$), and a mixture gas including at least two gases thereof as an etch gas. For instance, the mixture gas can include $N_2$, $H_2$, $Cl_2$, and HBr, or $N_2$, $O_2$, HBr, and $Cl_2$. A flow rate of the $SiCl_4$ gas ranges from about 0.5 sccm to about 100 sccm. Furthermore, during the etching of the amorphous carbon layer 33, a tetrachlorosilane ($SiCl_4$) gas is added to the etch gas as a passivation gas. The etching of the amorphous carbon layer 33 includes using a plasma etcher selected from transformer coupled plasma (TCP), inductively coupled plasma (ICP), and capacitively coupled plasma (CCP). Also, the etching of the amorphous carbon layer 33 includes using a pressure ranging from about 5 mTorr to about 100 mTorr, a top power ranging from about 200 W to about 1,200, and a bottom power ranging from about 10 W to about 500 W.

If the amorphous carbon layer 33 is etched under the above described condition, a first polymer 37 generated during the etching of the amorphous carbon layer 33 clings to the etched surfaces of the amorphous carbon pattern 33A. The first polymer 37 is transformed to a silicon containing polymer by the $SiCl_4$ gas. As the addition gas used to form the first polymer 37, a silicon containing gas which can be used as a plasma etch gas may be used in addition to the $SiCl_4$ gas.

The first polymer can increase a bar critical dimension (BCD) of the amorphous carbon pattern 33A, and can control a critical dimension bias to have no bias. As a result, the hard mask pattern 101 to which the first polymer 37 clings is obtained.

Figure 4C:
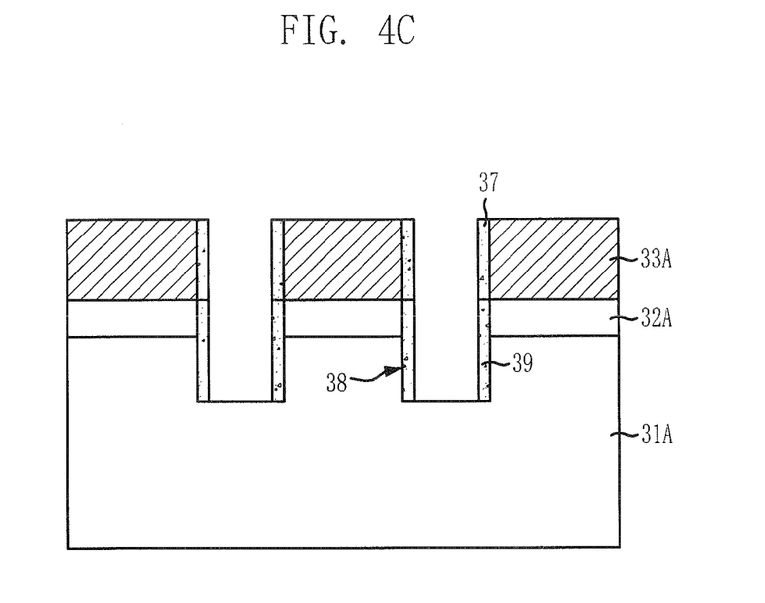

As shown in FIG. 4C, the etch barrier layer 32 is etched using the hard mask pattern 101 as an etch barrier to form an etch barrier pattern 32A. Continuously, a recess etching process is performed to etch the substrate 31 to a certain thickness. A first patterned substrate 31A is obtained due to the etching of the substrate 31. The SiON pattern 34A of the hard mask pattern 101 is removed and thus may not remain. The amorphous carbon pattern 33A serves as an etch barrier during the etching of the etch barrier layer 32.

A recess etching process is performed to form a recess pattern 38 in the first patterned substrate 31A. The recess etching process proceeds adding the $SiCl_4$ gas to control sidewalls of the recess pattern 38 to be formed in a vertical profile. Particularly, the etching of the etch barrier layer 32 includes using a mixture gas including tetrafluoromethane ($CF_4$) and $O_2$. The etching of the substrate 31 includes using a gas selected from a group consisting of $Cl_2$, HBr, $O_2$, $N_2$, helium (He), sulfur hexafluoride ($SF_6$), $CF_4$, and a mixture gas including at least two gases thereof. Also, the etching of the substrate 31 includes using a pressure ranging from about 5 mTorr to about 100 mTorr, a top power ranging from about 200 W to about 1,200 W, and a bottom power ranging from about 10 W to about 500 W.

Since the etching of the etch barrier layer 32 and the substrate 31 is performed adding the $SiCl_4$ gas, a second polymer 39 clings to the etched surfaces (e.g., sidewalls) of the etch barrier pattern 32A and the recess pattern 38. Since the $SiCl_4$ gas is added, the second polymer 39 is transformed to a silicon containing polymer the same as the first polymer 37. For the addition gas used to form the second polymer 39, a silicon containing gas which can be used as a plasma etch gas may be used in addition to the $SiCl_4$ gas.

As described above, if the second polymer 39 is formed, the recess pattern 38 has sidewalls formed in vertical profiles. Particularly, the second polymer 39 can control a critical dimension bias of the recess pattern 38 to have no bias. Meanwhile, the etching of the amorphous carbon layer 33, the etching of the etch barrier layer 32, and the etching of the substrate 31 are performed in-situ or ex-situ.

Figure 4D:
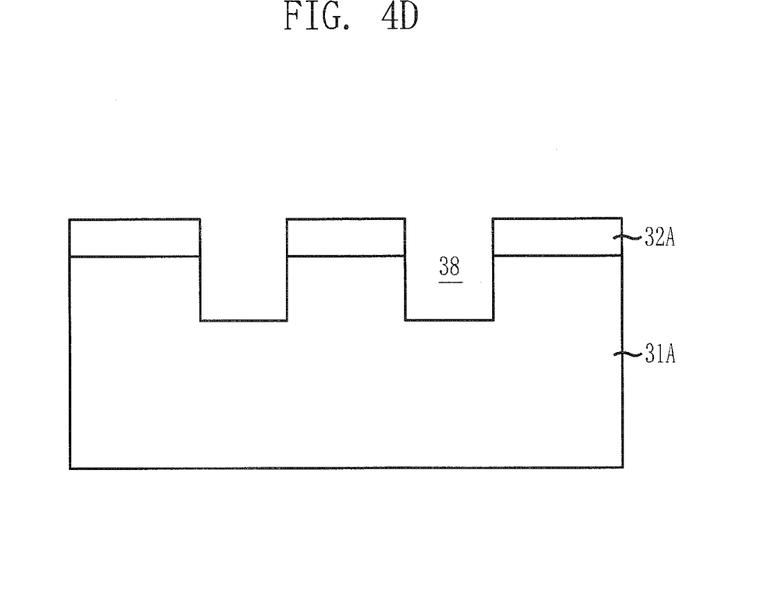

As shown in FIG. 4D, the amorphous carbon pattern 33A which is remaining after the recess etching process is removed. The amorphous carbon pattern 33A is removed at a stripper using oxygen plasma.

A cleaning process is performed to remove the first and second polymers 37 and 39. After the cleaning process, the etch barrier pattern 32A remains over the first patterned substrate 31A and the recess pattern 38 is formed in the first substrate 31.

Figure 4E:
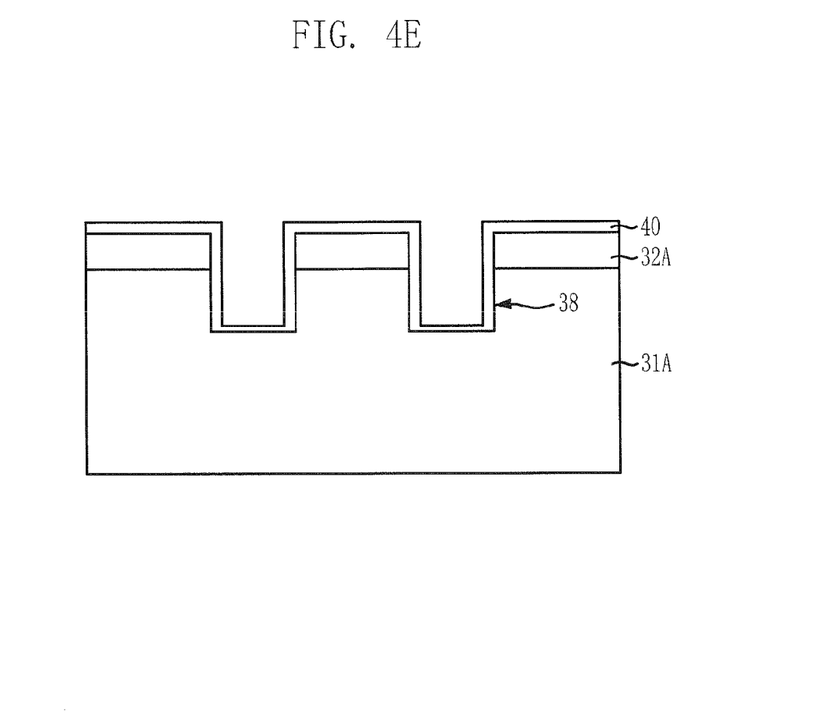

As shown in FIG. 4E, a plasma oxide layer 40 is formed over an entire surface of the first patterned substrate 31A using plasma. During the formation of the plasma oxide layer 40, the plasma oxide layer 40 is formed over the sidewalls of the recess pattern 38 and upper portions of the etch barrier pattern 32A to a greater thickness than over a bottom portion of the recess pattern 38. The plasma oxide layer 40 is formed via a plasma oxidation process using $N_2$ and $O_2$ gases at a plasma etcher in which the $SiCl_4$ gas can be used. After or before the formation of the plasma oxide layer 40, the $SiCl_4$ gas which is the silicon containing gas is added, thereby generating a silicon containing polymer (not shown) over an upper or bottom portion of the plasma oxide layer 40 in advance. Also, the plasma oxide layer 40 and the polymer can be formed simultaneously using the $N_2$ and $O_2$ gases and the $SiCl_4$ gas. The polymer protects the sidewalls of the recess pattern 38 during a subsequent etch back process.

Figure 4F:
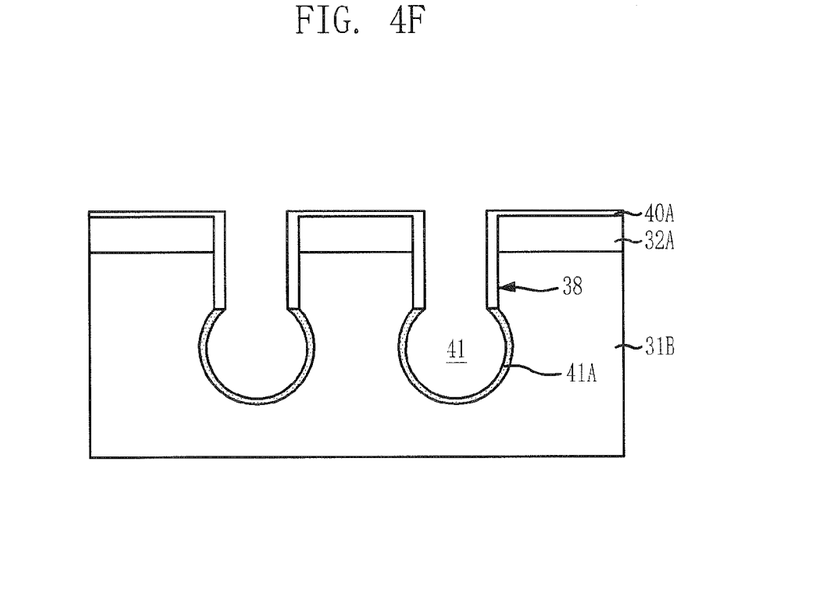

As shown in FIG. 4F, the plasma oxide layer 40 is subjected to an etch back process to remain the plasma oxide layer 40 as spacers 40A over the sidewalls of the etch barrier pattern 32A and the recess pattern 38. As a result, the spacers 40A expose the bottom portion of the recess pattern 38 and cover the remaining portions of the resultant structure. A second patterned substrate 31B via the etch back process is obtained. Since the plasma oxide layer 40 is formed over the bottom portions of the recess pattern 38 to a smaller thickness, only the bottom portion of the recess pattern 38 can be selectively exposed after the etch back process. Furthermore, the polymer generated after or before the formation of the plasma oxide layer 40 is selectively etched via the etch back process, thereby exposing the bottom portion of the recess pattern 38. Particularly, the etch back process of the plasma oxide layer 40 includes using a mixture gas including $CF_4$, trifluoromethane ($CHF_3$), and $O_2$ in-situ at a chamber used to form the plasma oxide layer 40.

The exposed bottom portion of the recess pattern 38 is subjected to an isotropic etching process to form a ball pattern 41. The spacers 40A serve as a passivation layer to prevent a damage over the sidewalls of the recess pattern 38. The isotropic etching process includes using a gas selected from a group consisting of $Cl_2$, HBr, $SF_6$, $CF_4$, $O_2$, He, and a mixture gas including at least two gases thereof. Also, the isotropic etching process includes using a pressure ranging from about 5 mTorr to about 70 mTorr, a top power ranging from about 200 W to about 1,200 W, and a bottom power ranging from about 0 W to about 100 W. A $SiCl_4$ gas with a flow rate ranging from about 0.5 sccm to about 100 sccm is added as a passivation gas to form a third polymer 41A. The third polymer 41A protects sidewalls of the ball pattern 41 and controls a size of the ball pattern 41. The third polymer 41A is a silicon containing polymer which is same as the first and second polymers 37 and 39. The forming of the plasma oxide layer 40, the performing of the etch back process to the plasma oxide layer 40, and the performing of the isotropic etching process to form the ball pattern 41 sequentially proceed at the same chamber.

Figure 4G:
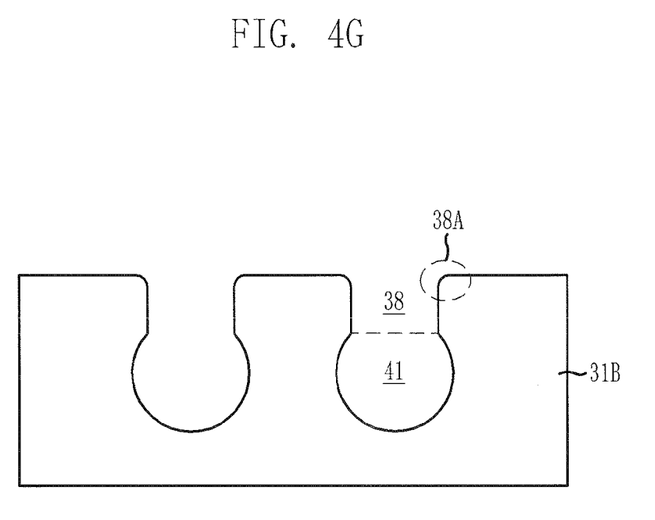

As shown in FIG. 4G, a cleaning process is performed to remove the spacers 40A, the etch barrier pattern 32A and the third polymer 41A. As a result, a bulb-shaped recess pattern including the recess pattern 38 and the ball pattern 41 is formed.

A light etch treatment process known as a subsequent treatment is performed to cure a surface damage of the recess patterns 38 and the ball patterns 41, and reduce a height of a horn (not shown) generated during forming the recess pattern 38. Due to the light etch treatment, a rounding effect which a top corner 38A of the recess pattern 38 is rounded can be obtained, thereby reducing a point where a leakage current is generated.

Particularly, the performing of the light etch treatment includes using a mixture gas including $CF_4$ and $O_2$ at a down stream type plasma etcher. Accordingly, the damage generated by the plasma can be cured and the horn can be removed.

Figure 4H:
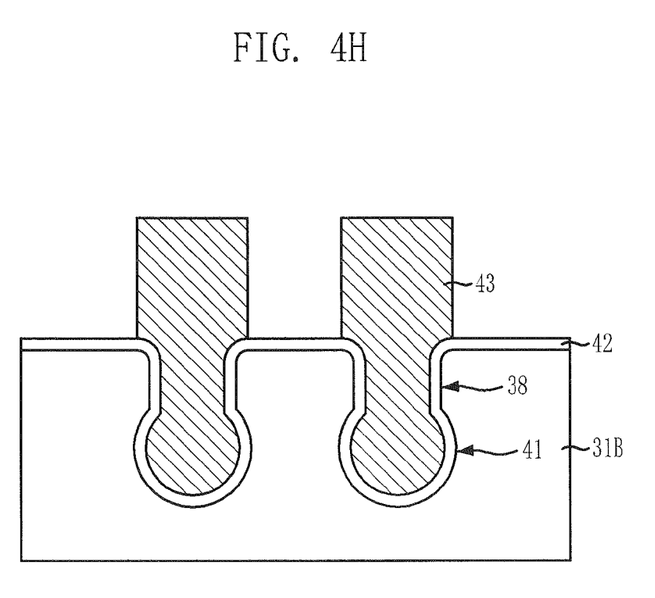

As shown in FIG. 4H, a gate insulation layer 42 is formed and then, a plurality of gate electrodes 43 are formed. As a result, the formation of the bulb-shaped recess gate is completed. In more detail of the formation of the gate electrodes 43, a polysilicon layer is formed until filling the recess pattern 38 and the ball pattern 41, and a metal electrode including tungsten is additionally formed. Then, a gate patterning process is performed to form the gate electrodes 43.

Figure 5A:
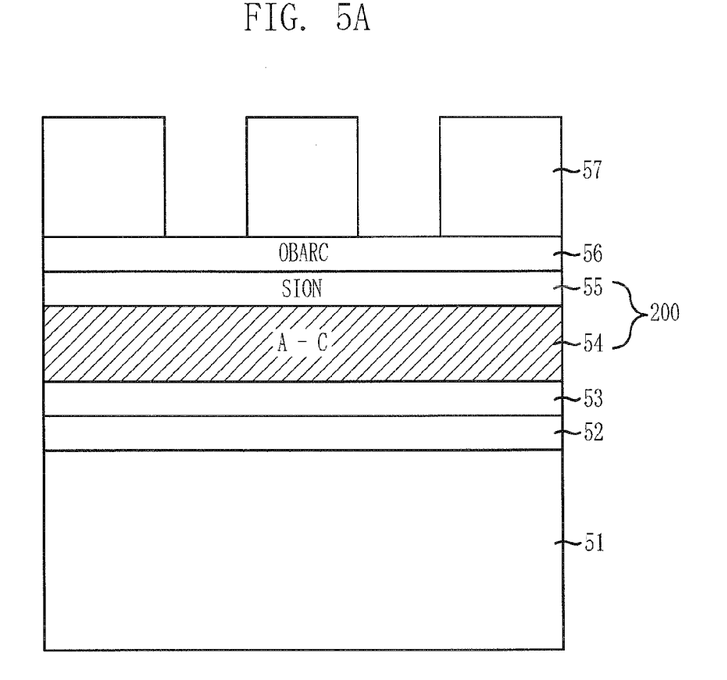
FIGS. 5A to 5I illustrate a method for fabricating a bulb-shaped recess pattern in accordance with another embodiment of the present invention.

FIGS. 5A to 5I illustrate a method for fabricating a bulb-shaped recess pattern in accordance with another embodiment of the present invention. As shown in FIG. 5A, an etch barrier layer 52 is formed over a substrate 51 in which an active region is defined. The etch barrier layer 52 serves as an etch barrier during an etching process to form a subsequent ball pattern. The etch barrier layer 52 includes an oxide layer.

A hard mask layer 200 required to perform a recess etching process is formed over the etch barrier layer 52. The hard mask layer 200 is obtained sequentially stacking a layer selected from the group consisting of a polysilicon layer, a SiON layer, an oxide layer, a double stack structure thereof, and a triple stack structure thereof, an amorphous carbon layer 54, a SiON layer 55, and combination thereof. It is exemplified in this embodiment of the present invention that a polysilicon layer 53 is formed beneath the amorphous carbon layer 54. The SiON layer 55 serves as an etch barrier during etching the amorphous carbon layer 54. The amorphous carbon layer 54 and the polysilicon layer 53 serve as an etch barrier during a recess etching process performed to the substrate 51. The polysilicon layer 53 secures selectivity which cannot be sufficiently secured by the amorphous carbon layer 54.

An anti-reflective coating layer 56 is formed over the hard mask layer 200. A photoresist layer is formed and then, a photo-exposure and developing process are performed to form a photoresist pattern 57 over the anti-reflective coating layer 56. The anti-reflective coating layer 56 includes an organic bottom anti-reflective coating (OBARC) layer. For instance, the OBARC layer includes SiON.

Figure 5B:
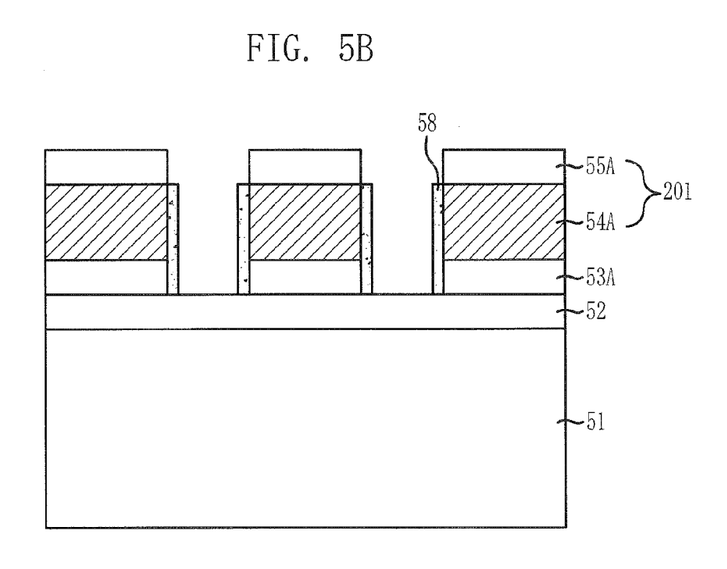

As shown in FIG. 5B, the anti-reflective coating layer 56 is etched using the photoresist pattern 57 as an etch barrier, and the hard mask layer 200 is continuously etched. In more detail of the etching of the hard mask layer 200, the SiON layer 55 is first etched and then, the amorphous carbon layer 54 and the polysilicon layer 53 are sequentially etched. As a result, a hard mask pattern 201 including a SiON pattern 55A, an amorphous carbon pattern 54A, a polysilicon pattern 53A, and combination thereof is obtained. For instance, the hard mask pattern 201 can be a multi-layered structure. When the amorphous carbon pattern 54A is formed, the photoresist pattern 57 and the anti-reflective coating layer 56 do not remain.

The etching of the amorphous carbon layer 54 and the polysilicon layer 53 includes using a gas selected from a group consisting of $N_2$, $H_2$, $O_2$, HBr, $Cl_2$, and a mixture gas including at least two gases thereof. Also, a $SiCl_4$ gas is added to the above listed etch gas as a passivation gas during the etching of the amorphous carbon layer 54 and the polysilicon layer 53.

If the amorphous carbon layer 54 and the polysilicon layer 53 are etched under the above described condition, a first polymer 58 generated during the etching of the amorphous carbon layer 54 and the polysilicon layer 53 clings to the etched surfaces of the amorphous carbon pattern 54A and the polysilicon pattern 53A. The first polymer 58 is transformed to a silicon containing polymer by adding the $SiCl_4$ gas. For the addition gas used to form the first polymer 58, a silicon containing gas which can be used as a plasma etch gas may be used in addition to the $SiCl_4$ gas.

Figure 5C:
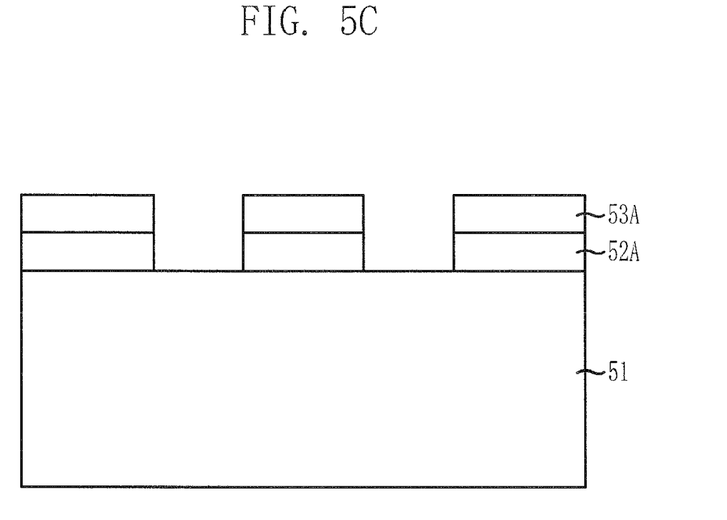

As shown in FIG. 5C, the etch barrier layer 52 is etched using the hard mask pattern 201 as an etch barrier. An etch barrier pattern 52A is obtained. The SiON pattern 55A is removed and does not remain.

The amorphous carbon pattern 54A is removed. As a result, only the polysilicon pattern 53A remains as the hard mask pattern 201. Particularly, the amorphous carbon pattern 54A is removed via a stripping process using oxygen plasma. During the stripping process performed to remove the amorphous carbon pattern 54A, the first polymer 58 is simultaneously removed.

Figure 5D:
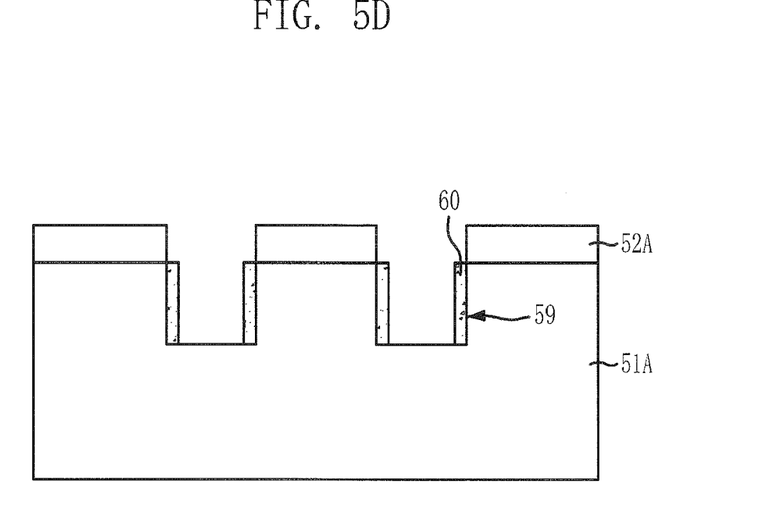

As shown in FIG. 5D, the substrate 51 is etched via a recess etching process to a certain thickness. A first patterned substrate 51A is obtained. The polysilicon pattern 53A is removed simultaneously with the etching of the substrate 51 and thus, does not remain. Accordingly, only the etch barrier pattern 52A remains over the first patterned substrate 51A when the recess etching process is completed.

Due to the recess etching process, a recess pattern 59 is formed in the first patterned substrate 51A. The $SiCl_4$ gas is added to control sidewalls of the recess pattern 59 to be formed in vertical profiles during the recess etching process. Particularly, the etching of the etch barrier layer 52 includes using a mixture gas including $CF_4$ and $O_2$. The etching of the substrate 51 includes using an HBr gas or a $Cl_2$ gas. Since the $SiCl_4$ gas is added during the etching of the substrate 51, a second polymer 60 clings to the etched surfaces (e.g., sidewalls) of the recess pattern 59. Due to the addition of the $SiCl_4$ gas, the second polymer 60 is transformed to a silicon containing polymer. For the addition gas to form the second polymer 60, a silicon containing gas which can be used as a plasma etch gas may be used in addition to the $SiCl_4$ gas.

As described above, if the second polymer 60 is generated, the sidewalls of the recess pattern 59 are formed in the vertical profiles. The second polymer 60 controls a critical dimension bias of the recess pattern 59 to have no bias. The etching of the amorphous carbon layer 54, the etching of the polysilicon layer 53, the etching of the etch barrier layer 52, and the etching of the substrate 51 can proceed in-situ or ex-situ.

Figure 5E:
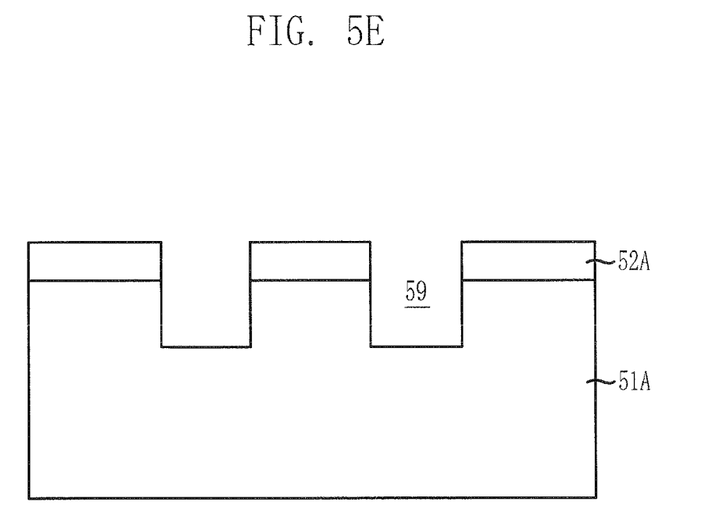

As shown in FIG. 5E, a cleaning process is performed to remove the second polymer 60. After the cleaning process, only the etch barrier pattern 52A remains over the first patterned substrate 51A, and the recess pattern 59 is formed in the first patterned substrate 51A.

Figure 5F:
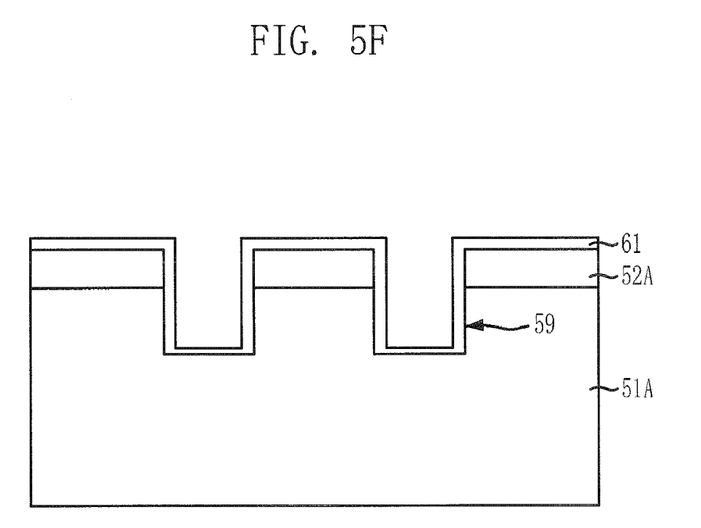

As shown in FIG. 5F, a plasma oxide layer 61 is formed over an entire surface of the first patterned substrate 51A using plasma. The plasma oxide layer 61 is formed over the sidewalls of the recess pattern 59 and the upper portion of the etch barrier patterns 52A to a greater thickness than over the bottom portion of the recess pattern 59. The plasma oxide layer 61 is formed via a plasma oxidation process using $N_2$ and $O_2$ gases at a plasma etcher in which the $SiCl_4$ gas can be used. After or before the formation of the plasma oxide layer 61, the $SiCl_4$ gas which is the silicon containing gas is added, thereby generating a silicon containing polymer (not shown) over an upper or bottom portion of the plasma oxide layer 61 in advance. Also, the plasma oxide layer 61 and the polymer can be formed simultaneously using the $N_2$ and $O_2$ gases and the $SiCl_4$ gas. The polymer protects the sidewalls of the recess pattern 59 during a subsequent etch back process.

Figure 5G:
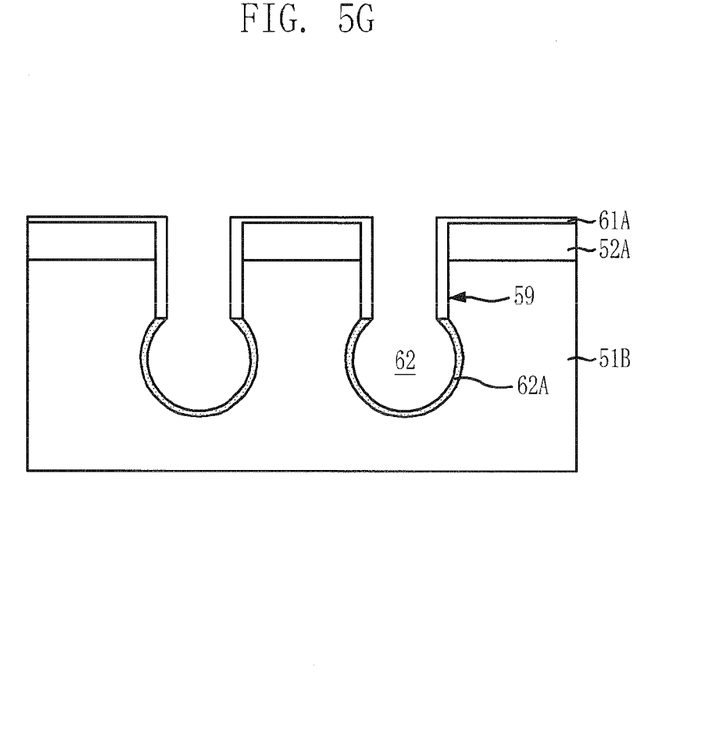

As shown in FIG. 5G, the plasma oxide layer 61 is subjected to an etch back process to remain the plasma oxide layer 61 in spacers 61A over the sidewalls of the etch barrier pattern 52A and the recess pattern 59. As a result, the bottom portion of the recess pattern 59 is exposed. Since the plasma oxide layer 61 is formed to a smaller thickness over the bottom portion of the recess pattern 59, the bottom portion of the recess pattern 59 can be selectively exposed after the etch back process. Also, the polymer generated before or after the formation of the plasma oxide layer 61 is selectively etched via the etch back process, thereby exposing the bottom portion of the recess pattern 59.

Particularly, the etch back process of the plasma oxide layer 61 is performed using a mixture gas including $CF_4$, $CHF_3$, and $O_2$ in-situ at the chamber used to form the plasma oxide layer 61.

The bottom portion of the recess pattern 59 is etched via an isotropic ethic process to form a ball pattern 62. The spacers 61A serve as an etch barrier to reduce a damage of the sidewalls of the recess pattern 59.

The performing of the isotropic etching process includes using a gas selected from a group consisting of $Cl_2$, HBr, $SF_6$, $CF_4$, $O_2$, He, and a mixture gas including at least two gases thereof. Also, the performing of the isotropic etching process includes using a pressure ranging from about 5 mTorr to about 70 mTorr, a top power ranging from about 200 W to about 1,200 W, and a bottom power ranging from about 0 W to about 100 W. Also, a $SiCl_4$ gas with a flow rate ranging from about 0.5 sccm to about 10 sccm is added as a passivation gas to form a third polymer 62A. The third polymer 62A protects sidewalls of the ball pattern 62 and controls a size of the ball pattern 62. The forming of the plasma oxide layer 61, the performing of the etch back process to the plasma oxide layer 61, and the performing of the isotropic etching process to form the ball pattern 62 sequentially proceed at the same chamber.

Figure 5H:
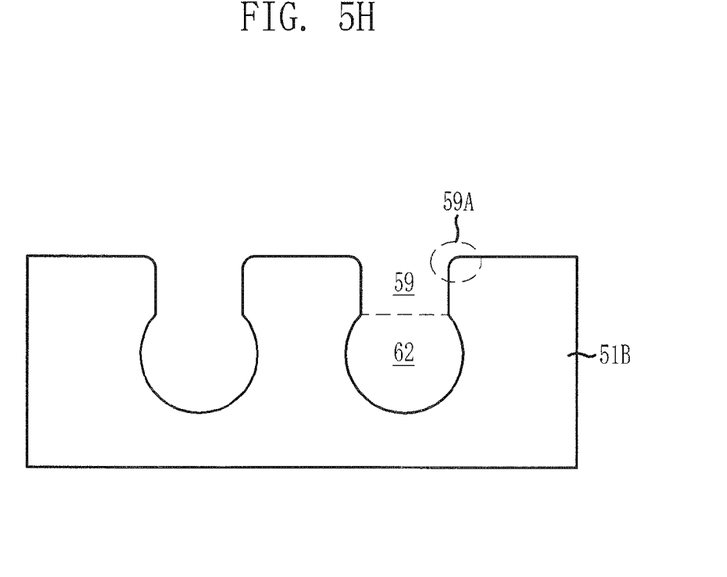

As shown in FIG. 5H, a cleaning process is performed to remove the spacers 61A, the etch barrier patterns 52A, and the third polymer 62A. Then, a light etch treatment known as a subsequent treatment is performed. The light etch treatment cures a surface damage of the recess pattern 59 and the ball pattern 62, and reduces a height of a horn (not shown) generated during forming the recess pattern 59. Also, a rounding effect which makes a top corner 59A of the recess pattern 59 round can be obtained via the light etch treatment, thereby removing a point where a leakage current is generated. The light etch treatment can be performed at a down stream type plasma etcher using a mixture gas including $CF_4$ and $O_2$. As a result, the damage caused by the plasma can be cured and the horn can be removed.

Figure 5I:
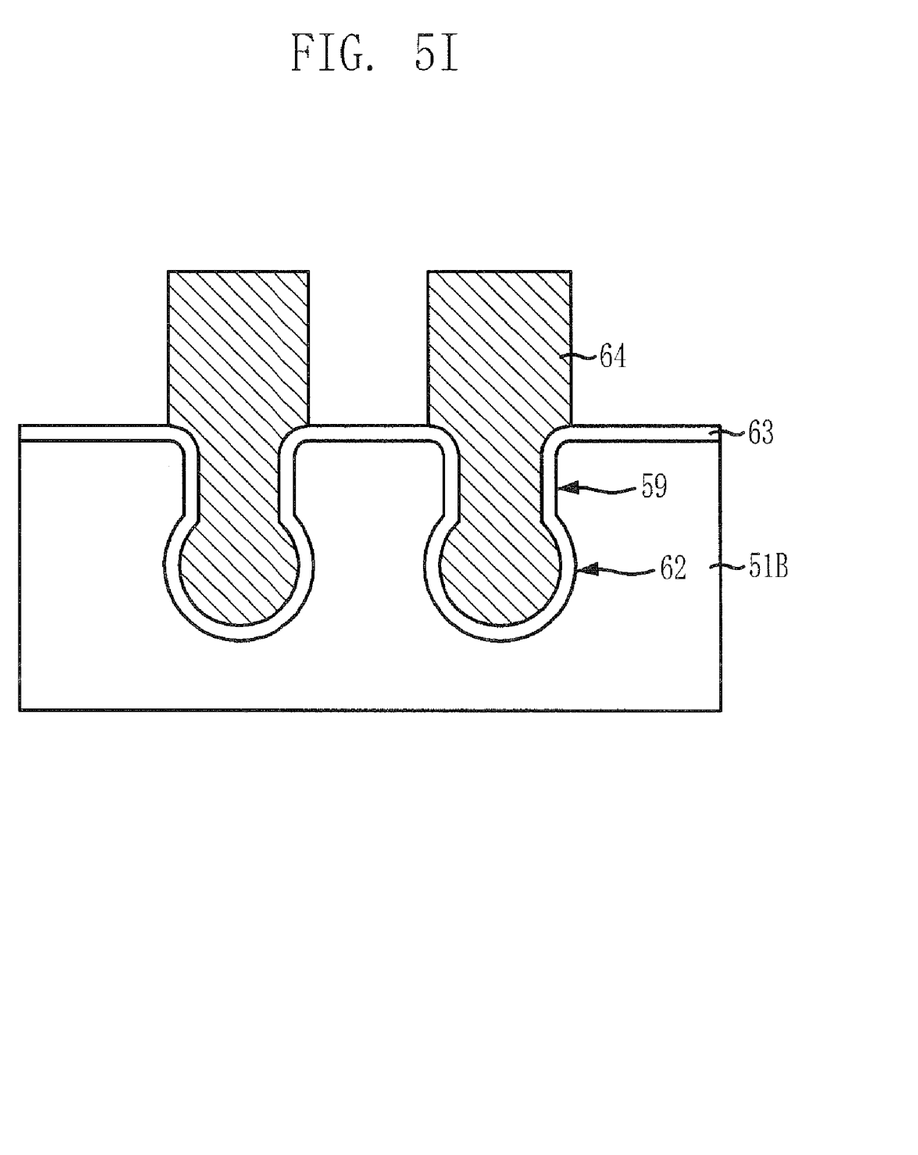

As shown in FIG. 5I, a gate insulation layer 63 is formed and then, a plurality of gate electrodes 64 are formed. As a result, a bulb-shaped recess gate pattern is formed. For the formation of the gate electrodes 64, a polysilicon layer is formed until filling the recess pattern 58 and the ball pattern 62. A metal electrode including tungsten is additionally formed. Then, a gate patterning process is performed to obtain the gate electrodes 64.

According to the embodiments of the present invention, since a plasma oxide layer is formed at a plasma etcher, a low temperature process can be employed. For instance, a process temperature at the plasma etcher is less than about 100° C. If the plasma oxide layer used as spacers at a low temperature is formed, a process time can be reduced. Furthermore, since the plasma oxide layer is formed to a relatively small thickness over a bottom portion of a recess pattern, a defect in which a ball pattern is not formed can be reduced. Due to the small thickness of the plasma oxide layer formed over the bottom portion of the recess pattern, an excessive etch is not necessary and thus, a top attack cannot be generated. A size of the ball pattern is not increased, thereby preventing a generation and shift of a seam.

According to the embodiments of the present invention, a bulb-shaped recess pattern which can reduce an increase in a critical dimension bias, a generation of bowing and sloped profile, a defect in a formation of a ball pattern, a top attack of a recess pattern, an increase and shift of a seam is formed.

Accordingly, a refresh property of a highly integrated device with a size of about 40 nm can be improved, thereby raising yields of products.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a bulb-shaped recess pattern, comprising:
    forming an etch barrier layer over a substrate;
    forming a hard mask layer over the etch barrier;
    forming a hard mask pattern whose sidewalls are coated with a first polymer generated during a step of etching a portion of the hard mask layer until the etch barrier layer is exposed, wherein the first polymer is formed only on the sidewalls of the hard mask pattern;
    forming a recess pattern whose sidewalls are coated with a second polymer generated during a step of etching the etch barrier layer and the substrate by using the hard mask pattern coated with the first polymer as an etch barrier;
    removing the first and second polymers and the hard mask pattern;
    forming a plurality of spacers exposing a bottom portion of the recess pattern; and
    etching the exposed bottom portion of the recess pattern to form a ball pattern.

2. The method of claim 1, wherein the first and second polymers include silicon containing polymers.

3. The method of claim 2, wherein forming of the first and second polymers proceeds with adding a silicon containing gas.

4. The method of claim 3, wherein the silicon containing gas includes tetrachlorosilane ($SiCl_4$).

5. The method of claim 1, wherein the forming of the hard mask layer includes:
    forming a stack structure including at least an amorphous carbon layer.

6. The method of claim 5, wherein the forming of the hard mask pattern includes:
    etching the stack structure including at least the amorphous carbon layer to form the hard mask pattern.

7. The method of claim 6, wherein the etching of the amorphous carbon layer of the hard mask pattern includes using a gas selected from a group consisting of nitrogen ($N_2$), hydrogen ($H_2$), oxygen ($O_2$), hydrogen bromide (HBr), chlorine ($Cl_2$), and a mixture gas including at least two gases thereof.

8. The method of claim 7, wherein the etching of the amorphous carbon layer includes using a plasma etcher selected from a group consisting of transformer coupled plasma (TCP), inductively coupled plasma (ICP) and capacitively coupled plasma (CCP), and applying a pressure ranging from about 5 mTorr to about 100 mTorr, a top power ranging from about 200 W to about 1,200 W, and a bottom power ranging from about 10 W to 500 W.

9. The method of claim 1, wherein the forming the recess pattern having sidewalls adhered with the second polymer comprises forming the second polymer by adding a silicon containing gas during etching the substrate.

10. The method of claim 9, wherein the silicon containing gas includes $SiCl_4$.

11. The method of claim 9, wherein the etching of the substrate includes using a gas selected from a group consisting of $Cl_2$, HBr, $O_2$, $N_2$, He, $SF_6$, $CF_4$, and a mixture gas including at least two gases thereof, and applying a pressure ranging from about 5 mTorr to about 100 mTorr, a top power ranging from about 200 W to about 1,200 W, and a bottom power ranging from about 10 W to about 500 W.

12. The method of claim 1, wherein while the etching of the exposed bottom portion of the recess pattern to form the ball pattern, a silicon containing gas is added to form another polymer over sidewalls of the ball pattern.

13. The method of claim 12, wherein the silicon containing gas includes $SiCl_4$ with a flow rate ranging from about 0.5 sccm to about 100 sccm.

14. The method of claim 1, wherein the forming of the spacers exposing the bottom portion of the recess pattern over the etch barrier layer includes:
    forming an oxide layer used as the spacers over the resultant structure obtained after removing the first and second polymers and the hard mask pattern; and
    etching a portion of the oxide layer via an etch back process to expose the bottom portion of the recess pattern.

15. The method of claim 14, wherein a thickness of the oxide layer formed over the bottom portion of the recess pattern is smaller than that of the oxide layer formed over the etch barrier layer and the sidewalls of the recess pattern.

16. The method of claim 15, wherein the forming of the oxide layer includes using a mixture gas including $N_2$ and $O_2$ and a plasma etcher.

17. The method of claim 16, wherein the forming of the polymer includes simultaneously using a mixture gas including $N_2$ and $O_2$, and a silicon containing gas.

18. The method of claim 16, wherein after the forming of the oxide layer using the mixture gas including $N_2$ and $O_2$, a silicon containing gas is used to form the polymer over the oxide layer.

19. The method of claim 16, wherein before the forming of the oxide layer using the mixture gas including $N_2$ and $O_2$, a silicon containing gas is used to form the polymer.

20. The method of claim 17, wherein the silicon containing gas includes $SiCl_4$.

21. The method of claim 14, wherein the etch back process is performed at a chamber used to form the oxide layer in-situ using a mixture gas including tetrafluoromethane ($CF_4$, trifluoromethane ($CHF_3$), and oxygen ($O_2$).

22. The method of claim 1, wherein the forming of the ball pattern includes using an isotropic etching process.

23. The method of claim 22, wherein the performing of the isotropic etching process includes using a gas selected from a group consisting of $Cl_2$, HBr, $SF_6$, $CF_4$, $O_2$, He, and a mixture gas including at least two gases thereof, and applying a pressure ranging from about 5 mTorr to about 70 mTorr, a top power ranging from about 200 W to about 1,200 W, and a bottom power ranging from about 0 W to about 100 W.

24. The method of claim 1, wherein the spacers and the ball pattern are sequentially formed at the same chamber.

25. The method of claim 1, wherein after the forming of the ball pattern, a light etch treatment is performed.

26. The method of claim 25, wherein the performing of the light etch treatment includes using a mixture gas including $CF_4$ and $O_2$, and a down stream type plasma etcher.

27. The method of claim 1, wherein the etch barrier layer includes an oxide layer.

* * * * *